United States Patent [19]

Yamane et al.

[11] Patent Number: 5,019,526

[45] Date of Patent: May 28, 1991

[54] METHOD OF MANUFACTURING A SEMICONDUCTOR DEVICE HAVING A PLURALITY OF ELEMENTS

[75] Inventors: Hiroyuki Yamane, Nagoya; Yasushi Higuchi, Kariya; Tetsuo Fujii, Toyohashi, all of Japan

[73] Assignee: Nippondenso Co., Ltd., Kariya, Japan

[21] Appl. No.: 249,514

[22] Filed: Sep. 26, 1988

[51] Int. Cl.$^5$ .......................................... H01L 21/265
[52] U.S. Cl. ......................................... 437/37; 437/69; 437/70; 437/238; 437/228; 156/628; 148/DIG. 117
[58] Field of Search ................ 437/24, 37, 69, 70, 437/228, 238; 156/662, 663, 628; 148/DIG. 117, DIG. 118

[56] References Cited

U.S. PATENT DOCUMENTS

| 3,752,711 | 8/1973 | Kooi | 148/33.3 |
| 3,970,486 | 7/1976 | Kooi | 437/69 |
| 4,407,696 | 10/1983 | Han et al. | 156/653 |
| 4,577,394 | 3/1986 | Peel | 437/70 |
| 4,746,625 | 5/1988 | Morita et al. | 437/63 |

FOREIGN PATENT DOCUMENTS

| 56-61139 | 5/1981 | Japan | 437/70 |
| 56-103445 | 8/1981 | Japan | 437/70 |
| 56-137648 | 10/1981 | Japan | 437/69 |
| 61-276342 | 12/1986 | Japan | 437/69 |
| 61-276343 | 12/1986 | Japan | 437/69 |
| 63-31124 | 2/1988 | Japan | 437/69 |

Primary Examiner—Olik Chaudhuri
Assistant Examiner—M. Wilczewski
Attorney, Agent, or Firm—Cushman, Darby & Cushman

[57] ABSTRACT

A method of manufacturing a semiconductor apparatus having a plurality of elements formed on a substrate comprises forming a pad oxidized film on the surface of the semiconductor substrate, forming a pattern of silicon nitride film to coat device areas on the pad oxidized film, and injecting boron ions into that surface of the pad oxidized film where no silicon nitride film is present, thereby to form a channel stopper region. Using the pattern of the silicon nitride film as a mask, a heat oxidized film is then formed on an elements separating region by heat oxidization, and ions of Si, N, C, or the like are injected into the surface of the heat oxidized film with such an acceleration energy that the ions are not injected into the silicon nitride film thereby to change the quality of the heat oxidized film. The silicon nitride film is removed by etching and the heat oxidized film is etching-treated by a solution of the hydrofluoric acid group to etching-remove particularly the bird's beak portions each of which is present along and under the peripheral rim of an element area of the silicon nitride film.

11 Claims, 2 Drawing Sheets

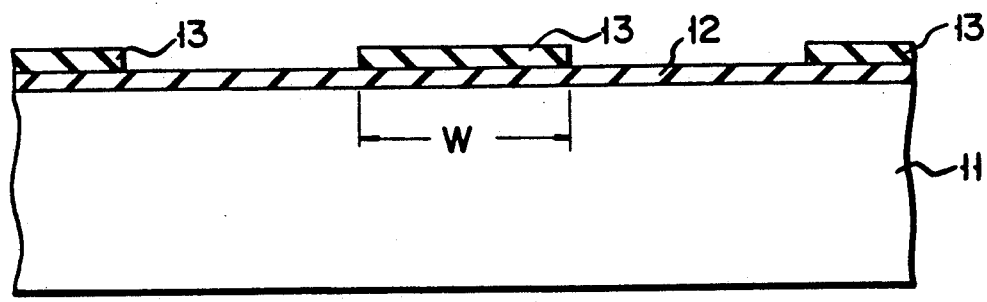
F I G. 1
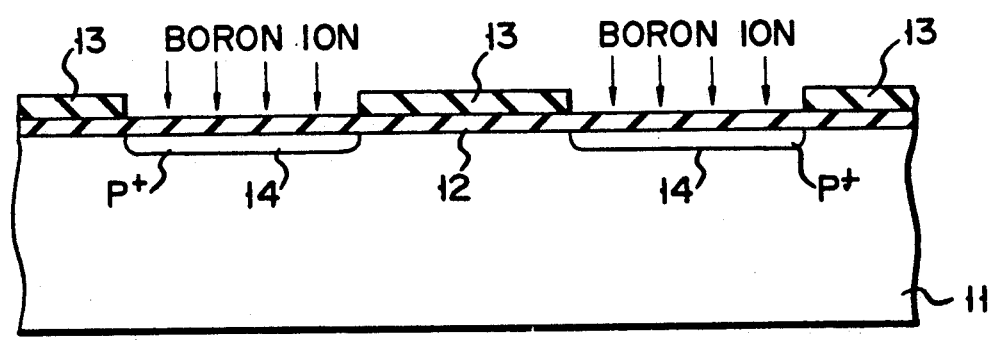
F I G. 2
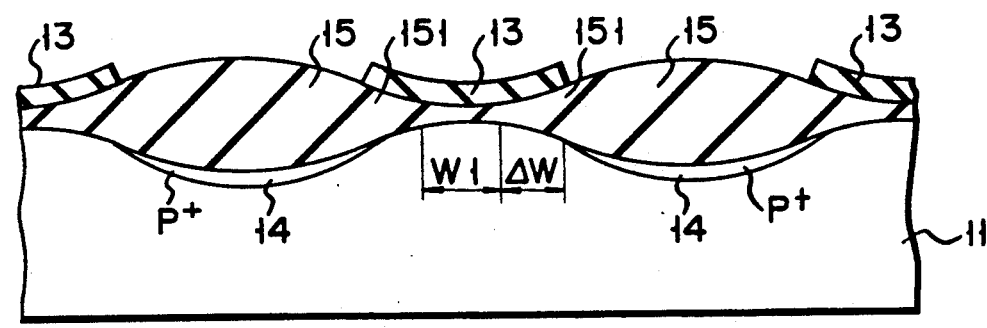
F I G. 3
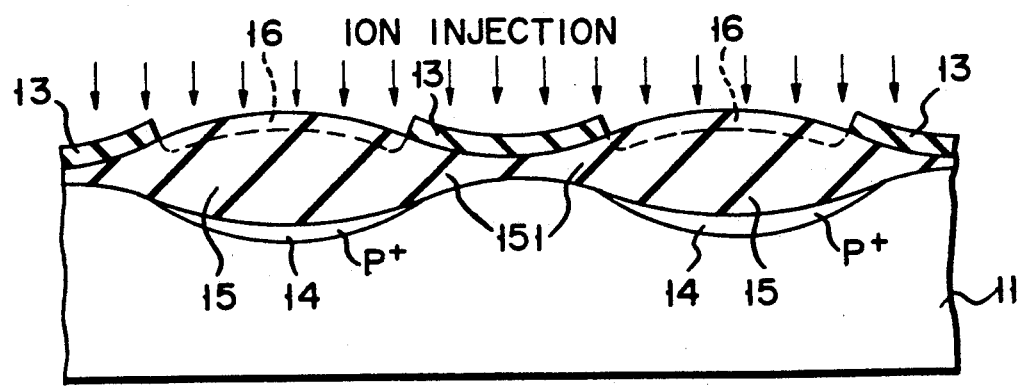
F I G. 4

METHOD OF MANUFACTURING A SEMICONDUCTOR DEVICE HAVING A PLURALITY OF ELEMENTS

BACKGROUND OF THE INVENTION

1. Field of the Invention

The present invention relates to a method of manufacturing a semiconductor apparatus which comprises a semiconductor substrate and plural elements formed on the substrate. More particularly, it relates to a method of manufacturing a semiconductor apparatus comprising elements arranged on a substrate at as high a density as in an LSI, in which method regions separating the elements are formed sufficiently narrow, thereby enhancing the integration density of the apparatus.

2. Description of the Related Art

To manufacture a semiconductor apparatus having a high integration density, like an LSI, plural elements are formed on a semiconductor substrate, and regions are also formed on the substrate to separate the elements from one another. In a known method, such regions (hereinafter called "separating regions") are formed by oxidizing the selected portions of an insulation layer. This selective oxidation is called a LOCOS process.

In the LOCOS process, a pattern mask of silicon nitride is formed on those portions of a semiconductor substrate (a silicon wafer) where elements will be formed. (These portions of the substrate will be referred to as "element regions.") When the pattern mask has been formed, the substrate is heated and oxidized. As a result, an oxide film is formed on those portions of the substrate which are not covered by the pattern mask and are thus exposed.

The LOCOS process is easy to perform, and serves to manufacture a semiconductor apparatus with a high degree of accuracy. In view of this, the LOCOS process is advantageous. However, when this process is peformed, thus forming narrower separating regions, thereby to enhance the integration density of the semiconductor apparatus, the following problem will arise.

When the substrate is heated and oxidized, with a pattern mask formed on the element regions of the substrate, even those unexposed portions of the substrate which extend along the edges of the mask patterns are oxidized, too. These portions are called "bird's beaks," and are usually as wide as about 0.6 μm.

What is used as an element region is that portion of the nitride film-covered area which excludes the bird's beaks. This means that each separating region includes the bird's beaks. It is therefore difficult to make the separating region sufficiently narrow. The bird's beaks must be eliminated in order to enhance the integration density of the semiconductor apparatus.

SUMMARY OF THE INVENTION

An object of the invention is to provide a method of manufacturing a semiconductor apparatus, which can form sufficiently narrow seprating regions on a semiconductor substrate, separating a plurality of elements formed on the substrate, thereby to enhance the integration density of the semiconductor apparatus.

Another object of the invention is to provide a method of manufacturing a semiconductor apparatus, which can form an oxide film on a semiconductor substrate by using a pattern mask, and can form bird's beaks under the edge portions of each mask pattern such that the bird's beaks are used as parts of element regions, thus reducing the width of separating regions so that the apparatus has a high integration density.

A further object of the invention is to provide a method of manufacturing a semiconductor apparatus, which can reduce the channel width of an semiconductor element. When a MOSFET is formed in each element region separated from the other element regions by the separating regions, the MOSFET has a channel width which is small enough to raise the threshold voltage of the MOSFET.

According to a method of manufacturing a semiconductor apparatus whereby a plurality of elements can be formed on a substrate, patterns of silicon nitride film are formed at those areas on the surface of the semiconductor substrate where elements are formed, and boron ions are injected into the surface of the substrate, using the pattern, to form a channel stop region and a heat oxidized film. Ions of Si, N or the like are then injected into the heat oxidized film with such an acceleration energy that the ions do not pass through the silicon nitride film to thereby to change the quality of the heat oxidized film, thereby forming a reformed layer. The silicon nitride film is then removed by an etching liquid of phospheric acid including even the bird's beak which is along and under the peripheral rim of each of pattern mask of the silicon nitride film.

The heat oxidized film is formed even under the silicon nitride film in the course of forming the heat oxidized film to thereby form the bird's beak along and under the peripheral rim of each of pattern mask of the silicon nitride film. The reformed layer is formed on the heat oxidized film where no silicon nitride film is present by ion injection. When the heat oxidized film (SiO$_2$) is etched after the silicon nitride film is removed, therefore, the bird's beak portions where no reformed layer is present are selectively etched to determine those portions where silicon nitride film is present as element areas, so that the elements separating region can be easily made narrow. Further, the bird's beak portions act to suck boron ions. Therefore, the concentration of boron ions which are injected to form a channel stopper becomes low at the element areas formed and the narrow channel effect of MOS transistors, for example, formed at the element areas can be thus effectively improved.

BRIEF DESCRIPTION OF THE DRAWINGS

FIGS. 1 through 6 are sectional views showing a method of manufacturing a semiconductor apparatus according to the present invention, particularly the process of forming an element separating region.

DETAILED DESCRIPTION OF THE PREFERRED EMBODIMENT

Figure 5:
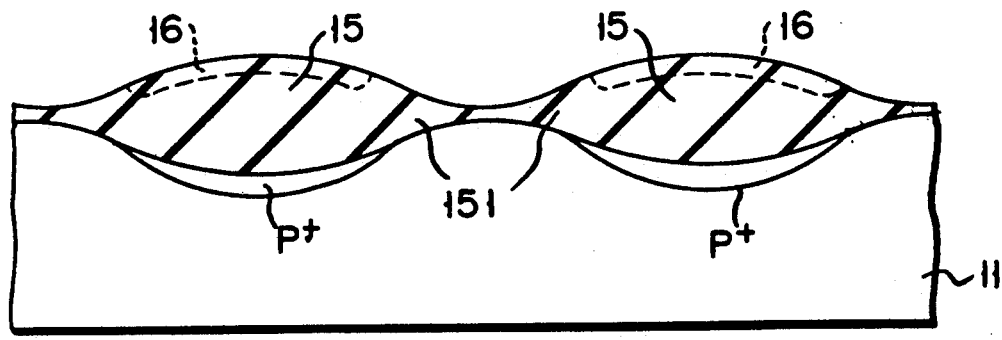

The present invention will be described referring to an example of forming polysilicon gates C - MOS. Needless to say, the present invention can be applied to bipolar elements and the like.

In FIG. 1, semiconductor substrate 11 is a silicon wafer, for example. Pad oxidized film 12 which is a thin silicon oxidized film is formed on the surface of semiconductor substrate 11 according to the heat oxidizing manner. Silicon nitride film is formed all over the pad oxidized film 12 according to the CVD manner. This silicon nitride film is etched to a certain pattern by photo-etching or the like to form silicon nitride film mask 13. Width W of a silicon nitride film mask 13 corresponds to an element area while that portion on semiconductor substrate 11 where no silicon nitride film mask is present and where pad oxidized film 12 is exposed corresponds to an element separating region in this case.

When silicon nitride film mask 13 are formed in this manner, boron ions are injected into that surface region of semiconductor substrate 11 which corresponds to the element separating region to form channel stopper region 14 of P+ type under the element separating region, as shown in FIG. 2.

That surface portion of semiconductor substrate 11 which includes no silicon nitride film mask 13 is heat-oxidized to form thick heat oxidized film 15 (LOCOS oxidization), as shown in FIG. 3.

An oxidized film which is called bird's beak 151 is formed along and under the peripheral rim of each of silicon nitride film masks 13 by this heat oxidizing treatment, entering only by width ΔW under silicon nitride film mask 13 and gradually tapering as it comes to its front end when seen in section. An area denoted by W1 and including no bird's beak 151 becomes smaller as compared with width W of silicon nitride film mask 13.

When heat oxidized film 15 is formed like this, ions of Si, N, C or the like are injected into all over semiconductor substrate 11, as shown in FIG. 4. The energy for accelerating ion in the course of this ions injection is selected to be such that the ions are not injected into the silicon nitride film, thereby to change the quality of the heat oxidized film.

Figure 7:
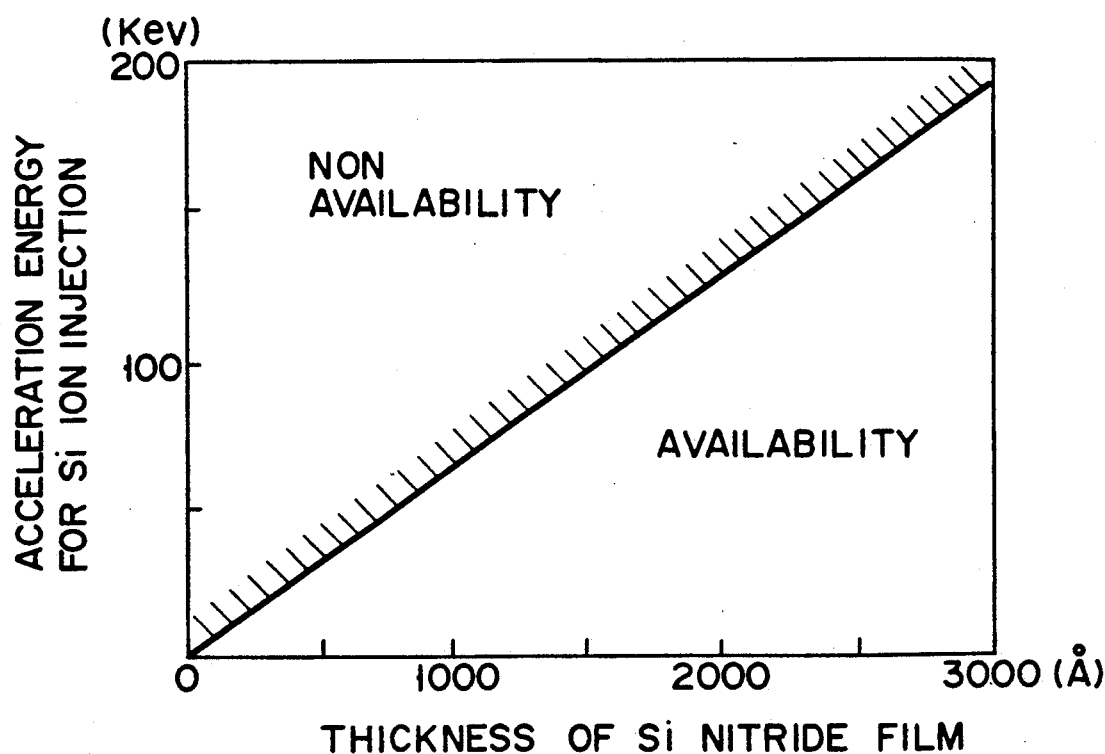
FIG. 7 is a graph showing a relation between the thickness of silicon nitride film and ion injection energy at the time when ions injection is conducted to form a reformed layer.

Considering the thickness of silicon nitride film mask 13 and the acceleration energy with which ions of Si cannot pass through mask 13 in a case where ions of Si, for example, are injected, the acceleration energy available in relation to the thickness of the silicon nitride film mask is shown in FIG. 7. The graph in FIG. 7 shows results calculated from the theory of LSS (Lindhard, Shariff, Schiott).

The surface of heat oxidized film 15 except bird's beak 151 is reformed by this ion injection process to thereby form surface reformed layer 16.

When silicon ions, for example, are injected, silicon-rich layer (SiOx) is formed as reformed layer 16 and when N ions, for example, are injected, oxynitride is formed as reformed layer 16. The etching speed at which these reformed layers 16 are etched by the etching liquid of hydrofluoric acid or the like is by far lower than in the case of common oxidized silicon.

When surface reformed layer 16 is formed in this manner, silicon nitride film mask 13 is removed, as shown in FIG. 5, after some heat treatment.

The removal of silicon nitride film mask 13 is carried out according to a common process such as wet etching by phosphoric acid, for example, or dry etching by fluorine plasma, for example. Only silicon nitride film mask 13 is selectively removed by this etching treatment.

Figure 6:
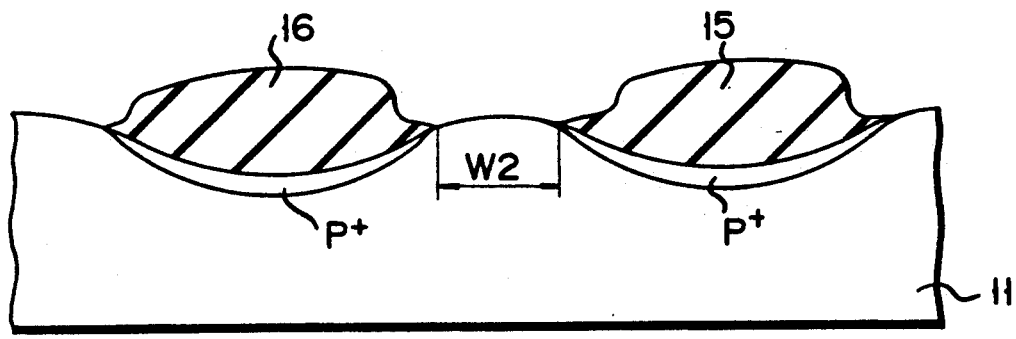

When heat oxidized film ($SiO_2$) 15 is etched by hydrofluoric acid solution after silicon nitride film mask 13 is removed, bird's beak portions 151 where no surface reformed layer 16 is present are mainly etched to expose the surface of semiconductor substrate 11, as shown in FIG. 6.

Bird's beak portions 151 are selectively removed and width W2 of an area partitioned by heat oxidized film 15 is made sufficiently larger than width W1 shown in FIG. 3. This area having width W2 is an element area and width W2 of this area is substantially equal to width W of silicon nitride film mask 13 shown in FIG. 1.

When channel stopper region 14 of P+ type which is formed by boron ions injection is heat-treated according to LOCOS oxidization to form heat oxidized film 15, it is elongated in the traverse direction, entering under the element areas, as shown in FIG. 3. When the region into which boron ions are injected is formed entering under the device areas like this, the narrow-channel effect acts on MOSFET, for example, formed at these device areas.

When bird's beak portions 151 are temporarily formed and then removed according to the present invention, however, the concentration of boron at the element areas partitioned by heat oxidized film 15 can be made sufficiently low because bird's beak portions 151 serve to absorb boron ions. Therefore, MOSFET, for example, formed at the element areas can be left free from the narrow-channel element, thereby effectively restraining threshold voltage of MOS transistors from rising.

What is claimed is:

1. A method of manufacturing a semiconductor device having a semiconductor substrate and a plurality of elements formed on the substrate, said method comprising the steps of:

oxidizing the entire surface of the semiconductor substrate, thereby forming a pad oxide film thereon;

forming a pattern of silicon nitride film on those parts of the pad oxide film where the elements will be formed;

forming a heat oxide film on those parts of the pad oxide film which are exposed;

injecting ions selected from the group consisting of Si, N and C into the surface of the heat oxide film with such an acceleration energy that the ions do not pass through the silicon nitride film, thereby to change the quality of the heat oxide film to form a reformed layer;

removing the pattern of silicon nitride film by means of a first etching process; and etching a part of the heat oxide film, excluding the region where the reformed layer has been formed, by a second etching process using an acid solution.

2. The method according to claim 1, whereby ions of Si are injected into the surface of the heat oxide film, in the process of forming the reformed layer.

3. The method according to claim 1, whereby ions of N are injected into the surface of the heat oxide film, in the process of forming the reformed layer.

4. The method according to claim 1, whereby ions of C are injected into the surface of the heat oxide film, in the process of forming the reformed layer.

5. The method according to claim 1, whereby a plurality of bird's beak portions of the heat oxide film are formed, each of said portions entering along and under the peripheral rim of an element area of silicon nitride film, in the process of forming the heat oxide film, and no reformed layer is formed on the surface of the bird's beak portions.

6. The method according to claim 1, whereby a plurality of bird's beak portions of the heat oxide film are formed, each of said portions entering along and under the peripheral rim of an element area of silicon nitride film, in the process of forming the heat oxide film, and the bird's beak portions on which no reformed layer is formed are selectively etched in the second etching process.

7. The method according to claim 1, further comprising injecting boron ions, using the pattern of silicon nitride film as a mask, to form $P^{+\circ}$type channel stopper region at that part of the semiconductor substrate where no silicon nitride film is present.

8. A method of manufacturing a semiconductor device having a semiconductor substrate and a plurality of elements formed on the substrate, said method comprising the steps of:

oxidizing the entire surface of the semiconductor substrate, thereby forming a pad oxide film thereon;

forming a pattern of silicon nitride film on those parts of the pad oxide film where the elements will be formed;

forming a heat oxide film on those parts of the pad oxide film which are exposed;

injecting ions selected from the group consisting of Si, N and C into the surface of the heat oxide film with such an acceleration energy that the ions do not pass through the silicon nitride film, thereby forming a reformed layer having a quality which is changed such that, when the heat oxide film is etched with use of an etchant, an etching rate of the region where the ions have been injected becomes smaller than the etching rate of the region where the ions have not been injected;

removing the pattern of the silicon nitride film by means of a first etching process; and etching a part of the heat oxide film with use of said etchant, excluding the part where the reformed layer has been formed, by means of a second etching process.

9. The method according to claim 8, whereby a plurality of bird's beak portions of the heat oxide film are formed, each of said portions entering along and under a peripheral rim of an element area of silicon nitride film, in the process of forming the heat oxide film, and no reformed layer is formed in the surface of the bird's beak portions.

10. The method according to claim 8, whereby a plurality of bird's beak portions of the heat oxide film are formed, each of said portions entering along and under the peripheral rim of an element area of silicon nitride film, in the process of forming the heat oxide film, and the bird's beak portions on which no reformed layer is formed are selectively etched in said etching process.

11. The method according to claim 8, further comprising injecting boron ions using the pattern of silicon nitride film as a mask, to form a $P^+$ type channel stopper region at that part of the semiconductor substrate where no silicon nitride film is present.

* * * * *